United States Patent
Xu et al.

(10) Patent No.: US 12,219,837 B2
(45) Date of Patent: Feb. 4, 2025

(54) DISPLAY PANEL HAVING AN EXTENSION WIRING CONNECTED TO A CATHODE LAYER AND METHOD FOR FABRICATING SAME

(71) Applicant: Shenzhen China Star Optoelectronics Semiconductor Display Technology Co., Ltd., Shenzhen (CN)

(72) Inventors: Qiankun Xu, Shenzhen (CN); Xingyu Zhou, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/610,509

(22) PCT Filed: Sep. 29, 2021

(86) PCT No.: PCT/CN2021/121598
§ 371 (c)(1),
(2) Date: Nov. 11, 2021

(87) PCT Pub. No.: WO2023/039953
PCT Pub. Date: Mar. 23, 2023

(65) Prior Publication Data
US 2024/0237448 A1    Jul. 11, 2024

(30) Foreign Application Priority Data

Sep. 17, 2021 (CN) .......................... 202111094996.3

(51) Int. Cl.
*H10K 59/131* (2023.01)
*H10K 59/12* (2023.01)
(Continued)

(52) U.S. Cl.
CPC ..... *H10K 59/1315* (2023.02); *H10K 59/1201* (2023.02); *H10K 59/1213* (2023.02); *H10K 59/122* (2023.02); *H10K 59/124* (2023.02)

(58) Field of Classification Search
CPC .......... H10K 59/1315; H10K 59/1201; H10K 59/122; H10K 59/1213; H10K 59/124
(Continued)

(56) References Cited

U.S. PATENT DOCUMENTS

2015/0144922 A1*   5/2015   Moon ................. H10K 59/131
                                                               257/40
2017/0125507 A1    5/2017   Lee et al.
(Continued)

FOREIGN PATENT DOCUMENTS

CN   103872040 A   6/2014
CN   105633297 A   6/2016
(Continued)

*Primary Examiner* — Xia L Cross
(74) *Attorney, Agent, or Firm* — Nathan & Associates; Menachem Nathan

(57) ABSTRACT

A display panel includes a light-emitting area and a cathode overlapping area, and further includes a first metal layer including a first wire located in the cathode overlapping area, a second metal layer disposed above the first metal layer and including a second wire located in the cathode overlapping area, a third metal layer disposed above the second metal layer and including an extension wire located in the cathode overlapping area, and a light-emitting device disposed above the second metal layer and located in the light-emitting area. The light-emitting device includes an anode layer, an organic functional layer, and a cathode layer in sequence. The cathode layer extends from the light-emitting area to the cathode overlapping area and is connected to the extension wire.

8 Claims, 3 Drawing Sheets

(51) Int. Cl.
  *H10K 59/121* (2023.01)
  *H10K 59/122* (2023.01)
  *H10K 59/124* (2023.01)
(58) Field of Classification Search
  USPC .......................................................... 257/40
  See application file for complete search history.

(56) References Cited

U.S. PATENT DOCUMENTS

2018/0122886 A1* 5/2018 Kim .................... H01L 27/1248
2018/0122890 A1 5/2018 Park et al.

FOREIGN PATENT DOCUMENTS

| CN | 105742324 A | 7/2016 |
|----|-------------|--------|
| CN | 106409870 A | 2/2017 |
| CN | 106847867 A | 6/2017 |
| CN | 108122955 A | 6/2018 |
| CN | 108336107 A | 7/2018 |
| CN | 110061152 A | 7/2019 |
| CN | 110752250 A | 2/2020 |
| CN | 110808340 A | 2/2020 |
| CN | 110911461 A | 3/2020 |
| CN | 210349841 U | 4/2020 |
| CN | 211150599 U | 7/2020 |
| CN | 111564481 A | 8/2020 |
| CN | 111755487 A | 10/2020 |
| CN | 112310306 A | 2/2021 |
| CN | 112416168 A | 2/2021 |

\* cited by examiner

DISPLAY PANEL HAVING AN EXTENSION WIRING CONNECTED TO A CATHODE LAYER AND METHOD FOR FABRICATING SAME

FIELD OF INVENTION

The present disclosure relates to the technical field of display, and particularly to a display panel and a method for fabricating the same.

BACKGROUND

Organic light-emitting diode (OLED) display devices have OLED top-emitting device structures. OLED display devices are recognized by industry as a third generation display technology after liquid crystal display (LCD) due to their advantages such as lightness, thinness, active light emission, fast response speed, wide viewing angles, rich color, high brightness, low power consumption, and high and low temperature resistance. OLED display devices can be widely used in terminal products such as smart phones, tablet computers, and televisions.

Currently, in an organic light emitting diode display device, there is a problem of voltage drop (i.e. IR drop) caused by a large surface electric resistance of a cathode electrode. As people pursue higher resolutions, a resolution of screens has evolved from 2K to 4K or even 8K, refreshing records time and time again. Furthermore, organic light-emitting diode display devices have evolved from usual 60 Hz to popular 120 Hz. However, a circuit of the display devices usually adopts a two-layer metal structure to form signal wires, which is difficult to meet a requirement of multiple signal wires in a circuit design. The main reason is that it is general to use copper (Cu) wires as the signal wires, and the copper wires cannot be made thinner, so more wires cannot be disposed in a limited space. Moreover, the two-layer metal structure limits a number of different signal wires, so that signal requirements cannot be met.

SUMMARY OF DISCLOSURE

A purpose of the present disclosure is to provide a display panel and a method for fabricating the same, so as to solve the technical problem that in a current circuit, more wires cannot be disposed in a limited space, so that signal requirements cannot be met.

In order to achieve the above purpose, the present disclosure provides a display panel comprising a light-emitting area and a cathode overlapping area. The display panel further comprises a first metal layer comprising a first wire located in the cathode overlapping area, a second metal layer disposed above the first metal layer and comprising a second wire located in the cathode overlapping area, a third metal layer disposed above the second metal layer and comprising an extension wire located in the cathode overlapping area, and a light-emitting device disposed above the second metal layer and located in the light-emitting area. The light-emitting device comprises an anode layer, an organic functional layer, and a cathode layer in sequence. The cathode layer extends from the light-emitting area to the cathode overlapping area and is connected to the extension wire.

Furthermore, the display panel further comprises a bonding area. The cathode overlapping area is located between the light-emitting area and the bonding area. The first metal layer further comprises a first electrode located in the light-emitting area. The second metal layer further comprises a second electrode, a third electrode, and a third wire. The second electrode and the third electrode are located in the light-emitting area. The third wire is located in the bonding area.

Furthermore, the display panel further comprises a passivation layer, a first metal protection layer, and a second metal protection layer. The passivation layer is disposed between the second metal layer and the third metal layer. The passivation layer is provided with a first opening exposing the second electrode and a second opening exposing the third wire. The first metal protection layer fills the first opening and extends to a part of a surface of the passivation layer. The second metal protection layer is disposed in a same layer as the first metal protection layer, covers a part of a surface of the third wire in the second opening, and extends to another part of the surface of the passivation layer.

Furthermore, the display panel further comprises a planarization layer disposed on the passivation layer and located in the light-emitting area and the cathode overlapping area. The planarization layer is provided with a third opening exposing a part of the first metal protection layer and a fourth opening exposing a part of the extension wire. The anode layer fills the third opening and is connected to the second electrode through the first metal protection layer.

Furthermore, the display panel further comprises a third metal protection layer and a planarization layer. The third metal protection layer covers the extension wire and is located in the cathode overlapping area. The planarization layer is disposed on the passivation layer and located in the light-emitting area and the cathode overlapping area. The planarization layer is provided with a third opening exposing a part of the first metal protection layer and a fourth opening exposing a part of the third metal protection layer. The anode layer fills the third opening and is connected to the second electrode through the first metal protection layer.

Furthermore, the display panel further comprises a pixel definition layer covering the anode layer and the planarization layer and located in the light-emitting area and the cathode overlapping area. The pixel definition layer is provided with a fifth opening exposing the anode layer. The organic functional layer is disposed in the fifth opening. The cathode layer is disposed on the pixel definition layer, fills the fourth opening, and is connected to the extension wire.

Furthermore, the display panel further comprises a glass substrate and a thin film transistor layer disposed on the glass substrate. The thin film transistor layer comprises: an active layer disposed on the glass substrate and located in the light-emitting area; an insulating layer comprising a first insulating layer disposed on the active layer and located in the light-emitting area, and a second insulating layer disposed on the glass substrate and located in the cathode overlapping area; the first metal layer comprising the first electrode disposed on the first insulating layer and located in the light-emitting area, and the first wire disposed on the second insulating layer and located in the cathode overlapping area; a dielectric layer covering the first electrode, the first wire, and the glass substrate, located in the light-emitting area, the cathode overlapping area, and the bonding area, and provided with a first via hole and a second via hole, wherein the first via hole and the second via hole are located on opposite sides of the first electrode in the light-emitting area and penetrate to a surface of the active layer; and the second metal layer comprising the second electrode filling the first via hole, extending to a part of a surface of the dielectric layer, and connected to the active layer, the third electrode filling the second via hole, extending to another part of the surface of the dielectric layer, and connected to the active layer, the second wire disposed on the dielectric layer and located in the cathode overlapping area, and the third wire disposed on the dielectric layer and located in the bonding area.

Furthermore, a projection of the extension wire on the glass substrate at least partially overlaps a projection of the second wire on the glass substrate.

Furthermore, the first metal layer, the second metal layer, and the third metal are made of copper or copper alloy. The extension wire is an auxiliary cathode wire or a signal wire.

In order to achieve the above purpose, the present disclosure further provides a method for fabricating a display panel comprising a light-emitting area and a cathode overlapping area. The method comprises: forming a first metal layer; patterning the first metal layer to form a first electrode located in the light-emitting area and a first wire located in the cathode overlapping area; forming a second metal layer above the first metal layer; patterning the second metal layer to form a second wire located in the cathode overlapping area; forming a third metal layer above the second metal layer; patterning the third metal layer to form an extension wire located in the cathode overlapping area; and forming a light emitting device above the second metal layer and located in the light emitting area, wherein the light emitting device comprises an anode layer, an organic functional layer, and a cathode layer in sequence, and the cathode layer extends from the light-emitting area to the cathode overlapping area and is connected to the extension wire.

Furthermore, the display panel further comprises a bonding area. The cathode overlapping area is located between the light-emitting area and the bonding area. In the step of patterning the second metal layer, the second metal layer is patterned to further form a second electrode, a third electrode, and a third wire. The second electrode and the third electrode are located in the light-emitting area. The third wire is located in the bonding area.

In a display panel and a method for fabricating the same provided by the present disclosure, a metal layer is disposed in a cathode overlapping area to form an extension wire as an auxiliary cathode wire. The auxiliary cathode wire is connected to a cathode layer above it through a metal protection layer. That is, the cathode layer covering an entire surface of the display panel and the auxiliary cathode wire are juxtaposed in a metal grid. This can greatly reduce an electric resistance between a middle and periphery of the display panel, thereby reducing a voltage drop. Furthermore, the display panel has a three-layer metal structure. A projection of a third metal layer (i.e. the auxiliary cathode wire) on a glass substrate at least partially overlaps with a projection of a second wire of a second metal layer on the glass substrate, which is beneficial to save a wiring space and can meet a requirement of multiple signal wires.

BRIEF DESCRIPTION OF DRAWINGS

Specific implementation of the present disclosure will be described in detail below in conjunction with accompanying drawings to make technical solutions and beneficial effects of the present disclosure obvious.

Figure 1:
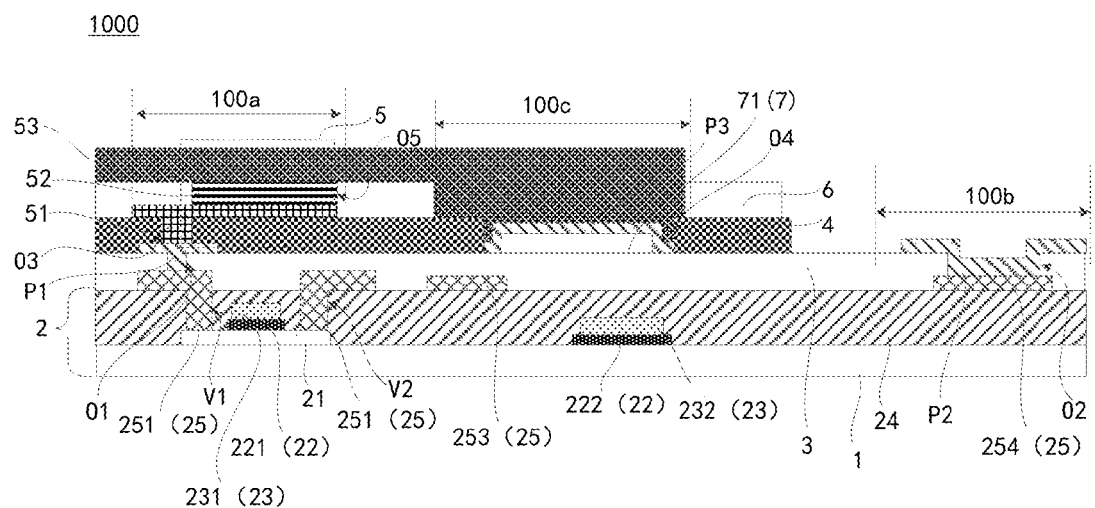
FIG. 1 is a cross-sectional view of a display panel according to an embodiment of the present disclosure.

Reference numerals in the accompanying drawings comprise:

1000: display panel; 100*a*: light emitting area; 100*b*: bonding area; 100*c*: cathode overlapping area; 1: glass substrate; 2: thin film transistor layer; 3: passivation layer; 4: flat layer; 5: light-emitting device; 6: pixel definition layer; 7: third metal layer; 21: active layer; 22: insulating layer; 23: first metal layer; 24: dielectric layer; 25: second metal layer; 221: first insulating layer; 222: second insulating layer; 231: first electrode; 232: first wire; 251: second electrode; 252: third electrode; 253: second wire; 254: The third wire; 51: anode layer; 52: organic functional layer; 53: cathode layer; 71: auxiliary cathode wire; O1: first opening; O2: second opening; O3: third opening; O4: fourth opening; O5: fifth opening; P1: first metal protection layer; P2: second metal protection layer; P3: third metal protection layer; V1: first via hole; and V2: the second via hole.

DETAILED DESCRIPTION

Technical solutions in embodiments of the present disclosure will be clearly and completely described below in conjunction with accompanying drawings in the embodiments of the present disclosure. In a description of the present disclosure, it should be understood that terms "first" and "second" are merely used for descriptive purposes and should not to be construed as indicating or implying a relative importance or implicitly indicating a number of the indicated technical features. Therefore, the features defined by "first" and "second" may explicitly or implicitly comprise one or more of the features. In the description of the present disclosure, a term "a plurality of" means "two or more" unless otherwise specifically limited.

As shown in FIG. 1, this embodiment provides a display panel 1000 comprising a light-emitting area 100*a*, a bonding area 100*b*, and a cathode overlapping area 100*c* located between the light-emitting area 100*a* and the bonding area 100*b*.

The display panel 1000 comprises a glass substrate 1, a thin film transistor layer 2, a passivation layer 3, a planarization layer 4, a light emitting device 5, and a pixel definition layer 6.

The thin film transistor layer 2 may comprise a plurality of thin film transistors. Each of the thin film transistors may have a back channel etch (BCE) structure, an etch stop layer (ESL) structure, or the like, which will not be described in detail herein.

In this embodiment, the thin film transistor layer 2 comprises an active layer 21, an insulating layer 22, a first metal layer 23, a dielectric layer 24, and a second metal layer 25.

The active layer 21 is disposed on the glass substrate 1 and located in the light-emitting area 100*a*.

The insulating layer 22 comprises a first insulating layer 221 and a second insulating layer 222. The first insulating layer 221 is disposed on the active layer 21 and located in the light-emitting area 100*a*. The second insulating layer 222 is disposed on the glass substrate 1 and located in the cathode overlapping area 100*c*.

The first metal layer 23 is patterned to form a first electrode 231 and a first wire 232. The first electrode 231 is disposed on the first insulating layer 221 and located in the light-emitting area 100a. The first electrode 231 is a gate electrode. The first wire 232 is disposed on the second insulating layer 222 and is located in the cathode overlapping area 100c. The first wire 232 is a scan line. In this embodiment, the first metal layer 23 is made of one or more of copper, iron, and aluminum, preferably copper or copper alloy.

The dielectric layer 24 covers the first electrode 231, the first wire 232, and the glass substrate 1, and is located in the light-emitting area 100a, the cathode overlapping area 100c, and the bonding area 100b. Specifically, in the light-emitting area 100a, the dielectric layer 24 is provided with a first via hole V1 and a second via hole V2 located on opposite sides of the first electrode 231 and penetrating to a surface of the active layer 21. In this embodiment, the dielectric layer 24 is made of one or more of silicon nitride and silicon oxide.

The second metal layer 25 is disposed on an upper surface of the dielectric layer 24. The second metal layer 25 is patterned to form a second electrode 251, a third electrode 252, a second wire 253, and a third wire 254. The second electrode 251 and the third electrode 252 are both located in the light-emitting area 100a. The second wire 253 is located in the cathode overlapping area 100c. The third wire 254 is located in the bonding area 100b. The second metal layer 25 is made of one or more of iron, aluminum, molybdenum, copper, etc., preferably copper or copper alloy.

Specifically, the second electrode 251 fills the first via hole V1, extends to a part of a surface of the dielectric layer 24, and is connected to the active layer 21. The third electrode 252 fills the second via hole V2, extends to another part of the surface of the dielectric layer 24, and is connected to the active layer 21. The second wire 253 is disposed on the dielectric layer 24 and located in the cathode overlapping area 100c. The third wire 254 is disposed on the dielectric layer 24 and located in the bonding area 100b.

The passivation layer 3 is disposed on the second metal layer 25. The passivation layer 3 is provided with a first opening O1 and a second opening O2. The first opening O1 exposes the second electrode 251. The second opening O2 exposes the third wire 254.

The first metal protection layer P1 fills the first opening O1 and extends to a part of a surface of the passivation layer 3.

The second metal protection layer P2 is disposed in a same layer as the first metal protection layer P1, covers a surface of the third wire 254, and extends to another part of the surface of the passivation layer 3. The second metal protection layer P2 is configured to protect the third wire 254 and make the third wire 254 have good conductivity, acid resistance, and heat resistance.

The third metal layer 7 is disposed above the second metal layer 25. Specifically, the third metal layer 7 is disposed on the passivation layer 3 and is patterned to form an extension wire located in the cathode overlapping area 100c. The third metal layer 7 is made of one or more of iron, aluminum, molybdenum, copper, etc., preferably copper or copper alloy.

In this embodiment, a projection of the extension wire on the glass substrate 1 at least partially overlaps a projection of the second wire 253 on the glass substrate 1, which is beneficial to save a wiring space and can meet requirements of multiple signal wires.

In this embodiment, the display panel 1000 further comprises a third metal protection layer P3 covering the extension wire and located in the cathode overlapping area 100c. The third metal protection layer P3 is configured to protect the third metal layer 7 and make the third metal layer 7 have good conductivity, acid resistance, and heat resistance.

In this embodiment, the first metal protection layer P1, the second metal protection layer P2, and the third metal protection layer P3 are all made of molybdenum-titanium composite material, titanium, or indium tin oxide, and are mainly configured to protect a metal layer, prevent the metal layer from being oxidized and acidified in other processes, and make the metal layer have good conductivity and heat resistance.

In this embodiment, the extension wire may be an auxiliary cathode wire 71 or a signal wire (not shown). When the extension wire is the auxiliary cathode wire 71, the auxiliary cathode wire 71 is connected to a cathode layer 53 above it. That is, an entirety of the cathode layer 53 and the auxiliary cathode wire 71 are juxtaposed in a metal grid, which can greatly reduce an electric resistance between a middle and periphery of the display panel 1000, thereby reducing a voltage drop.

The planarization layer 4 is disposed on the passivation layer 3 and located in the light-emitting area 100a and the cathode overlapping area 100c. The planarization layer 4 is provided with a third opening O3 exposing a part of the first metal protection layer P1 and a fourth opening O4 exposing a part of the extension wire.

Furthermore, in other embodiments, in order to protect a surface of the extension wire, it is necessary to form a metal protection layer (i.e. the third metal protection layer P3) on the surface of the extension wire. It should be noted that in an actual manufacturing process, the extension wire is first formed on the passivation layer 3. Then, the third metal protection layer P3 is formed on the extension wire. Finally, the planarization layer 4 is dug to form the fourth opening O4 to expose a part of the third metal protection layer P3.

The light-emitting device 5 is disposed above the second metal layer 25 and located in the light-emitting area 100a. The light-emitting device 5 comprises an anode layer 51, an organic functional layer 52, and the cathode layer 53 in sequence. In this embodiment, the anode layer 51 fills the third opening O3 and is connected to the second electrode 251 through the first metal protection layer P1.

In this embodiment, the display panel 1000 further comprises a pixel definition layer 6 covering the anode layer 51 and the planarization layer 4, and located in the light-emitting area 100a and the cathode overlapping area 100c. The pixel definition layer 6 is provided with a fifth opening O5 exposing a part of the anode layer 51.

In this embodiment, the organic functional layer 52 is disposed in the fifth opening O5. The organic functional layer 52 may comprise a hole injection layer, a hole transport layer, a light emitting layer, an electron transport layer, an electron injection layer, etc., to improve a light emitting efficiency of the light emitting device 5 and extend a service life of the light emitting device 5.

The cathode layer 53 is disposed on the pixel definition layer 6 and extends from the light-emitting area 100a to the cathode overlapping area 100c. In this embodiment, the cathode layer 53 fills the fourth opening O4, and is connected to the extension wire.

It should be noted that the light-emitting device 5 is a top-emitting OLED device, the cathode layer 53 is a very thin and semi-transparent metal layer covering an entire surface of the display panel 1000, and a resistivity of the cathode layer 53 is very high. The light-emitting device 5 is a current element. After a current flows from a middle to a periphery of the display panel 1000, a large voltage drop will be caused due to a high electric resistance of the cathode layer 53. Accordingly, in this embodiment, the auxiliary cathode wire 71 is disposed in the cathode overlapping area 100c and is connected to the cathode layer 53 above it through the metal protection layer P3. That is, the entirety of the cathode layer 53 and the auxiliary cathode wire 71 are juxtaposed in the metal grid, which can greatly reduce an electric resistance between the middle and periphery of the display panel 1000, thereby reducing the voltage drop.

In an actual operation of the light-emitting device 5, a current flowing from the anode layer 51 of the light-emitting device 5 flows out from the middle to the periphery of the display panel 1000 through the auxiliary cathode wire 71 as a main channel. That is, the current flows through the cathode layer 53 and a nearby overlapping hole (that is, the fourth opening O4). An electric resistance of the auxiliary cathode wire 71 is much less than the electric resistance of the cathode layer 53, which helps to reduce the voltage drop.

This embodiment further provides a method for fabricating a display panel 1000. The display panel 1000 comprises a light-emitting area 100a, a bonding area 100b, and a cathode overlapping area 100c located between the light-emitting area 100a and the bonding area 100b, as shown in FIG. 1.

Figure 2:
FIG. 2 is a flowchart of a method for fabricating a display panel according to an embodiment of the present disclosure.

As shown in FIG. 2, the method for fabricating the display panel 1000 comprises the following steps S1 to S12.

As shown in FIG. 2, the method for fabricating the display panel comprises the following steps S1 to S12.

S1: forming a first metal layer 23.

S2: patterning the first metal layer 23 to form a first electrode 231 located in the light-emitting area 100a and a first wire 232 located in the cathode overlapping area 100c.

Figure 3:
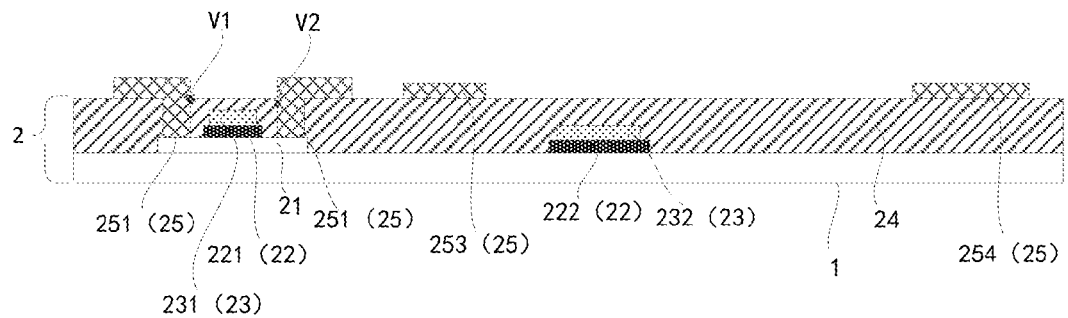
FIG. 3 is a schematic structural diagram of a thin film transistor layer according to an embodiment of the present disclosure.

As shown in FIG. 3, the first metal layer 23 is patterned to form a first electrode 231 and a first wire 232. The first electrode 231 is disposed on the first insulating layer 221 and located in the light-emitting area 100a. The first electrode 231 is a gate electrode. The first wire 232 is disposed on the second insulating layer 222 and is located in the cathode overlapping area 100c. The first wire 232 is a scan line. In this embodiment, the first metal layer 23 is made of one or more of copper, iron, and aluminum, preferably copper or copper alloy.

S3: forming a dielectric layer 24 covering the first electrode 231, the first wire 232, and the glass substrate 1 and located in the light-emitting area 100a, the cathode overlapping area 100c, and the bonding area 100b.

Please refer to FIG. 3, in the light-emitting area 100a, the dielectric layer 24 is provided with a first via hole V1 and a second via hole V2 located on opposite sides of the first electrode 231 and penetrating to a surface of the active layer 21. In this embodiment, the dielectric layer 24 is made of one or more of silicon nitride and silicon oxide.

S4: forming a second metal layer 25 on the dielectric layer 24.

S5: patterning the second metal layer 25 to form a second wire 253 located in the cathode overlapping area 100c.

Specifically, patterning the second metal layer 25 to form a second electrode 251, a third electrode 252, the second wire 253, and a third wire 254. The second electrode 251 and the third electrode 252 are located in the light-emitting area 100a. The second wire 253 is located in the cathode overlapping area 100c. The third wire 254 is located in the bonding area 100b.

Please refer to FIG. 3, the second metal layer 25 is disposed on an upper surface of the dielectric layer 24. The second metal layer 25 is patterned to form the second electrode 251, the third electrode 252, the second wire 253, and the third wire 254. The second electrode 251 and the third electrode 252 are located in the light-emitting area 100a. The second wire 253 is located in the cathode overlapping area 100c. The third wire 254 is located in the bonding area 100b. The second metal layer 25 is made of one or more of iron, aluminum, molybdenum, copper, etc., preferably copper or copper alloy.

Specifically, the second electrode 251 fills the first via hole V1, extends to a part of a surface of the dielectric layer 24, and is connected to the active layer 21. The third electrode 252 fills the second via hole V2, extends to another part of the surface of the dielectric layer 24, and is connected to the active layer 21. The second wire 253 is disposed on the dielectric layer 24 and located in the cathode overlapping area 100c. The third wire 254 is disposed on the dielectric layer 24 and located in the bonding area 100b.

S6: forming a passivation layer 3 on the second metal layer 25.

Figure 4:
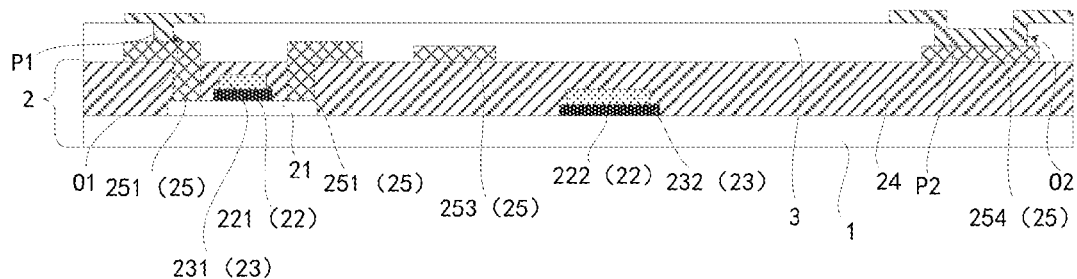
FIG. 4 is a schematic structural diagram of first and second metal protection layers according to an embodiment of the present disclosure.

As shown in FIG. 4, the passivation layer 3 is disposed on the second metal layer 25. The passivation layer 3 is provided with a first opening O1 and a second opening O2. The first opening O1 exposes the second electrode 251. The second opening O2 exposes the third wire 254.

S7: forming a first metal protection layer P1 and a second metal protection layer P2.

Please refer to FIG. 4, the first metal protection layer P1 fills the first opening O1 and extends to a part of a surface of the passivation layer 3. The second metal protection layer P2 is disposed in a same layer as the first metal protection layer P1, covers a surface of the third wire 254, and extends to another part of the surface of the passivation layer 3. The second metal protection layer P2 is configured to protect the third wire 254 and make the third wire 254 have good conductivity, acid resistance, and heat resistance.

S8: forming a third metal layer 7 on the passivation layer 3.

S9: patterning the third metal layer 7 to form an extension wire located in the cathode overlapping area 100c.

Figure 5:
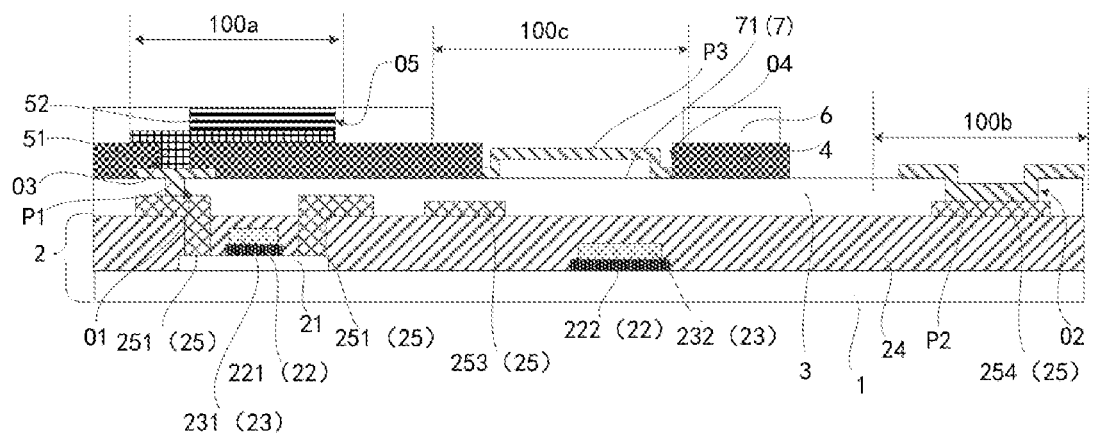
FIG. 5 is a schematic structural diagram of an auxiliary cathode wire and a light emitting device according to an embodiment of the present disclosure.

As shown in FIG. 5, the third metal layer 7 is disposed above the second metal layer 25. Specifically, the third metal layer 7 is disposed on the passivation layer 3 and is patterned to form an extension wire located in the cathode overlapping area 100c. The third metal layer 7 is made of one or more of iron, aluminum, molybdenum, copper, etc., preferably copper or copper alloy.

S10: forming a third metal protection layer P3 on the third metal layer 7.

Please refer to FIG. 5, the third metal protection layer P3 covers the extension wire and is located in the cathode overlapping area 100c. The third metal protection layer P3 is configured to protect the third metal layer 7 and make the third metal layer 7 have good conductivity, acid resistance, and heat resistance. It should be noted that in an actual manufacturing process, step S10 may be omitted. That is, those skilled in the art can determine whether to perform step S10 according to actual needs, which is not limited here.

S11: forming a planarization layer 4 on the passivation layer 3 and located in the light-emitting area 100a and the cathode overlapping area 100c.

Please refer to FIG. 5, the planarization layer 4 is provided with a third opening O3 exposing a part of the first metal protection layer P1 and a fourth opening O4 exposing a part of the third metal protection layer P3.

S12: forming a light emitting device 5 above the second metal layer 25 and located in the light emitting area 100a, wherein the light emitting device 5 comprises an anode layer 51, an organic functional layer 52, and a cathode layer 53 in sequence, and the cathode layer 53 extends from the light-emitting area 100a to the cathode overlapping area 100c and is connected to the extension wire.

Please refer to FIG. 5, after the anode layer 51 is formed, a pixel definition layer 6 is formed on the anode layer 51 and the planarization layer 4 in the light-emitting area 100a and the cathode overlapping area 100c. The pixel definition layer 6 is provided with a fifth opening O5 exposing a part of the anode layer 51.

After the pixel definition layer 6 is formed, the organic functional layer 52 is formed on the anode layer 51 in the fifth opening O5. The organic functional layer 52 may comprise a hole injection layer, a hole transport layer, a light emitting layer, an electron transport layer, an electron injection layer, etc., to improve a light emitting efficiency of the light emitting device 5 and extend a service life of the light emitting device 5.

Finally, please refer to FIG. 1, the cathode layer 53 is formed on the pixel defining layer 6 and extends from the light-emitting area 100a to the cathode overlapping area 100c. In this embodiment, the cathode layer 53 fills the fourth opening O4 and is connected to the extension wire.

It should be noted that the light-emitting device 5 is a top-emitting OLED device, the cathode layer 53 is a very thin and semi-transparent metal layer covering an entire surface of the display panel 1000, and a resistivity of the cathode layer 53 is very high. The light-emitting device 5 is a current element. After a current flows from a middle to a periphery of the display panel 1000, a large voltage drop will be caused due to a high electric resistance of the cathode layer 53. Accordingly, in this embodiment, the auxiliary cathode wire 71 is disposed in the cathode overlapping area 100c and is connected to the cathode layer 53 above it through the metal protection layer P3. That is, the entirety of the cathode layer 53 and the auxiliary cathode wire 71 are juxtaposed in the metal grid, which can greatly reduce an electric resistance between the middle and periphery of the display panel 1000, thereby reducing the voltage drop. In addition, a projection of the extension wire on the glass substrate 1 at least partially overlaps a projection of the second wire 253 on the glass substrate 1, which is beneficial to save a wiring space and can meet requirements of multiple signal wires.

The display panel and the method for fabricating the same provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A display panel, comprising:
A display panel, comprising a light-emitting area and a cathode overlapping area, and further comprising:
a first metal layer comprising a first wire located in the cathode overlapping area;
a second metal layer disposed above the first metal layer and comprising a second wire located in the cathode overlapping area;
a third metal layer disposed above the second metal layer and comprising an extension wire located in the cathode overlapping area; and
a light-emitting device disposed above the second metal layer, located in the light-emitting area, and comprising an anode layer, an organic functional layer, and a cathode layer in sequence, wherein the cathode layer extends from the light-emitting area to the cathode overlapping area and is connected to the extension wire;
the display panel further comprising a bonding area, wherein the cathode overlapping area is located between the light-emitting area and the bonding area, the first metal layer further comprises a first electrode located in the light-emitting area, the second metal layer further comprises a second electrode, a third electrode, and a third wire, the second electrode and the third electrode are located in the light-emitting area, and the third wire is located in the bonding area; and
the display panel further comprising a glass substrate and a thin film transistor layer disposed on the glass substrate, wherein the thin film transistor layer comprises:
an active layer disposed on the glass substrate and located in the light-emitting area;
an insulating layer comprising a first insulating layer disposed on the active layer and located in the light-emitting area, and a second insulating layer disposed on the glass substrate and located in the cathode overlapping area;
the first metal layer comprising the first electrode disposed on the first insulating layer and located in the light-emitting area, and the first wire disposed on the second insulating layer and located in the cathode overlapping area;
a dielectric layer covering the first electrode, the first wire, and the glass substrate, located in the light-emitting area, the cathode overlapping area, and the bonding area, and provided with a first via hole and a second via hole, wherein the first via hole and the second via hole are located on opposite sides of the first electrode in the light-emitting area and penetrate to a surface of the active layer; and
the second metal layer comprising the second electrode filling the first via hole, extending to a part of a surface of the dielectric layer, and connected to the active layer, the third electrode filling the second via hole, extending to another part of the surface of the dielectric layer, and connected to the active layer, the second wire disposed on the dielectric layer and located in the cathode overlapping area, and the third wire disposed on the dielectric layer and located in the bonding area.

2. The display panel according to claim 1, further comprising:
a passivation layer disposed between the second metal layer and the third metal layer, and provided with a first opening exposing the second electrode and a second opening exposing the third wire;
a first metal protection layer filling the first opening and extending to a part of a surface of the passivation layer; and
a second metal protection layer disposed in a same layer as the first metal protection layer, covering a part of a surface of the third wire in the second opening, and extending to another part of the surface of the passivation layer.

3. The display panel according to claim 2, further comprising:
a planarization layer disposed on the passivation layer, located in the light-emitting area and the cathode overlapping area, and provided with a third opening exposing a part of the first metal protection layer and a fourth opening exposing a part of the extension wire, wherein the anode layer fills the third opening and is connected to the second electrode through the first metal protection layer.

4. The display panel according to claim 3, further comprising:
a pixel definition layer covering the anode layer and the planarization layer, located in the light-emitting area and the cathode overlapping area, and provided with a fifth opening exposing the anode layer, wherein the organic functional layer is disposed in the fifth opening, and the cathode layer is disposed on the pixel definition layer, fills the fourth opening, and is connected to the extension wire.

5. The display panel according to claim 2, further comprising:
a third metal protection layer covering the extension wire and located in the cathode overlapping area; and
a planarization layer disposed on the passivation layer, located in the light-emitting area and the cathode overlapping area, and provided with a third opening exposing a part of the first metal protection layer and a fourth opening exposing a part of the third metal protection layer, wherein the anode layer fills the third opening and is connected to the second electrode through the first metal protection layer.

6. The display panel according to claim 5, further comprising:
a pixel definition layer covering the anode layer and the planarization layer, located in the light-emitting area and the cathode overlapping area, and provided with a fifth opening exposing the anode layer, wherein the organic functional layer is disposed in the fifth opening, and the cathode layer is disposed on the pixel definition layer, fills the fourth opening, and is connected to the third metal protection layer.

7. The display panel according to claim 1, wherein a projection of the extension wire on the glass substrate at least partially overlaps a projection of the second wire on the glass substrate.

8. A method for fabricating a display panel comprising a light-emitting area and a cathode overlapping area, comprising:
forming a first metal layer;
patterning the first metal layer to form a first electrode located in the light-emitting area and a first wire located in the cathode overlapping area;
forming a second metal layer above the first metal layer;
patterning the second metal layer to form a second wire located in the cathode overlapping area;
forming a third metal layer above the second metal layer;
patterning the third metal layer to form an extension wire located in the cathode overlapping area; and
forming a light emitting device above the second metal layer and located in the light emitting area, wherein the light emitting device comprises an anode layer, an organic functional layer, and a cathode layer in sequence, and the cathode layer extends from the light-emitting area to the cathode overlapping area and is connected to the extension wire;
wherein the display panel further comprises a bonding area, the cathode overlapping area is located between the light-emitting area and the bonding area, in the step of patterning the second metal layer, the second metal layer is patterned to further form a second electrode, a third electrode, and a third wire, the second electrode and the third electrode are located in the light-emitting area, and the third wire is located in the bonding area; and
the display panel further comprising a glass substrate and a thin film transistor layer disposed on the glass substrate, wherein the thin film transistor layer comprises:
an active layer disposed on the glass substrate and located in the light-emitting area;
an insulating layer comprising a first insulating layer disposed on the active layer and located in the light-emitting area, and a second insulating layer disposed on the glass substrate and located in the cathode overlapping area;
the first metal layer comprising the first electrode disposed on the first insulating layer and located in the light-emitting area, and the first wire disposed on the second insulating layer and located in the cathode overlapping area;
a dielectric layer covering the first electrode, the first wire, and the glass substrate, located in the light-emitting area, the cathode overlapping area, and the bonding area, and provided with a first via hole and a second via hole, wherein the first via hole and the second via hole are located on opposite sides of the first electrode in the light-emitting area and penetrate to a surface of the active layer; and
the second metal layer comprising the second electrode filling the first via hole, extending to a part of a surface of the dielectric layer, and connected to the active layer, the third electrode filling the second via hole, extending to another part of the surface of the dielectric layer, and connected to the active layer, the second wire disposed on the dielectric layer and located in the cathode overlapping area, and the third wire disposed on the dielectric layer and located in the bonding area.

* * * * *